United States Patent
Park et al.

(10) Patent No.: US 8,051,356 B2
(45) Date of Patent: Nov. 1, 2011

(54) APPARATUS AND METHOD FOR RECEIVING SIGNAL IN A COMMUNICATION SYSTEM

(75) Inventors: Sung-Eun Park, Seoul (KR); Dong-Seek Park, Yongin-si (KR); Jae Yoel Kim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 944 days.

(21) Appl. No.: 12/024,336

(22) Filed: Feb. 1, 2008

(65) Prior Publication Data

US 2008/0189589 A1 Aug. 7, 2008

(30) Foreign Application Priority Data

Feb. 2, 2007 (KR) .......................... 10-2007-0011098

(51) Int. Cl.
*H03M 13/00* (2006.01)
(52) U.S. Cl. ........................................ 714/752; 714/786
(58) Field of Classification Search .................. 714/752, 714/786, 801
See application file for complete search history.

(56) References Cited

U.S. PATENT DOCUMENTS

| | | | |
|---|---|---|---|
| 6,950,461 B2 * | 9/2005 | Goldstein et al. | 375/222 |
| 6,985,536 B2 * | 1/2006 | Oelcer et al. | 375/261 |
| 7,000,167 B2 * | 2/2006 | Coker et al. | 714/752 |
| 7,178,082 B2 | 2/2007 | Yu et al. | |
| 7,343,548 B2 * | 3/2008 | Blankenship et al. | 714/800 |
| 7,373,581 B2 * | 5/2008 | Okamura et al. | 714/752 |
| 7,458,009 B2 | 11/2008 | Yu et al. | |
| 7,484,158 B2 * | 1/2009 | Sharon et al. | 714/755 |
| 7,688,830 B2 * | 3/2010 | Lee et al. | 370/395.4 |
| 7,707,476 B2 * | 4/2010 | Seki | 714/755 |
| 7,725,802 B2 | 5/2010 | Eroz et al. | |
| 7,818,649 B1 * | 10/2010 | Farjadrad et al. | 714/758 |
| 2004/0153938 A1 | 8/2004 | Okamura et al. | |

FOREIGN PATENT DOCUMENTS

| | | |
|---|---|---|
| JP | 2004-186940 | 7/2004 |
| KR | 1020040092922 | 11/2004 |
| KR | 1020050035729 | 4/2005 |
| KR | 1020070035115 | 3/2007 |

* cited by examiner

*Primary Examiner* — Esaw Abraham
(74) *Attorney, Agent, or Firm* — The Farrell Law Firm, P.C.

(57) ABSTRACT

Provided are an apparatus and method for receiving a signal in a communication system, in which a signal is received and decoded by setting an offset indicating a start position of a node operation for each block column of a parity check matrix of a Low Density Parity Check (LDPC) code and scheduling an order of performing the node operation on a Partial Parallel Scheduling (PPS) group basis. Here, the parity check matrix includes p×L rows and q×L columns, the p×L rows are grouped into p block rows, the q×L columns are grouped into q block columns, and each PPS group includes one column from each of the q block columns.

14 Claims, 4 Drawing Sheets

APPARATUS AND METHOD FOR RECEIVING SIGNAL IN A COMMUNICATION SYSTEM

PRIORITY

This application claims priority under 35 U.S.C. §119(a) to a Korean Patent Application filed on Feb. 2, 2007 in the Korean Intellectual Property Office and assigned Serial No. 2007-11098, the entire disclosure of which is incorporated herein by reference.

BACKGROUND OF THE INVENTION

1. Field of the Invention

The present invention generally relates to a communication system. More particularly, the present invention relates to an apparatus and method for receiving a signal in a communication system.

2. Description of the Related Art

In general, communication systems are being developed to provide high-speed, large-data transmission services to Mobile Stations (MSs). In this context, Low Density Parity Check (LDPC) codes are seriously considered for the communication systems, because the LDPC codes are channel codes suitable for high-speed, large-data transmission.

With reference to FIG. 1, the configuration of a signal transmission apparatus in a conventional communication system using LDPC codes will be described below.

Referring to FIG. 1, the signal transmission apparatus includes an encoder 111, a modulator 113, and a transmitter 115. Upon generating transmission data, i.e. an information vector, the encoder 111 encodes the information vector to a codeword vector in a predetermined coding scheme. Herein, the coding scheme is an LDPC coding scheme, and thus the codeword vector is an LDPC codeword. The modulator 113 modulates the LDPC codeword in a predetermined modulation scheme. The transmitter 115 processes the modulated vector received from the modulator 113 and transmits the processed signal to a signal reception apparatus through an ANTenna (ANT).

With reference to FIG. 2, a configuration of a signal reception apparatus in a conventional communication system using LDPC codes will be described below.

Referring to FIG. 2, the signal reception apparatus includes a receiver 211, a demodulator 213, and a decoder 215. The receiver 211 processes a signal received from the signal transmission apparatus through an ANTenna (ANT). The demodulator 213 demodulates the received vector received from the receiver 211 in a demodulation scheme corresponding to the modulation scheme of the modulator 113. The decoder 215 decodes the demodulated vector received from the demodulator 213 in a decoding scheme corresponding to the coding scheme of the encoder 111 and outputs the decoded signal as a final recovered information vector. It is assumed herein that the decoding scheme, i.e. the LDPC decoding scheme, is performed by a sum-product iterative decoding algorithm.

An LDPC code is defined by a parity check matrix that mostly contains zeroes, and a very small number of non-zeroes, for example, ones. The LDPC code can be represented as a bipartite graph. The bipartite graph includes variable nodes (i.e. bit nodes), check nodes, and edges connecting the variable nodes and the check nodes.

A sum-product iterative decoding algorithm on the bipartite graph can decode the LDPC code. The sum-product algorithm is a type of message passing algorithm that exchanges messages along edges, calculates outgoing messages from incoming messages to the bit nodes or check nodes, and updates the nodes on the bipartite graph.

In implementing the message-passing algorithm on the bipartite graph, a bit node operation and a check node operation are sequentially performed, i.e., the bit node operation is sequentially performed on all bit nodes, and the check node operation is sequentially performed on all check nodes. As stated before, due to the nature of iterations of the LDPC decoding, the resulting increase in the time for detecting a final decoding result leads to an increase in an LDPC decoding time delay. Accordingly, there exists a need for reducing the time taken for LDPC decoding without affecting LDPC decoding performance.

SUMMARY OF THE INVENTION

An aspect of the present invention is to address at least the above-described problems and/or disadvantages and to provide at least the advantages described below. Accordingly, an aspect of the present invention is to provide an apparatus and method for receiving a signal in a communication system using a Low Density Parity Check (LDPC) code.

Moreover, an aspect of the present invention provides a signal reception apparatus and method for performing LDPC decoding by Partial Parallel Scheduling (PPS) in a communication system using an LDPC code.

In accordance with an aspect of the present invention, a signal reception apparatus in a communication system is provided. A decoder decodes a received signal by setting an offset indicating a start position of a node operation for each block column of a parity check matrix of an LDPC code and scheduling an order of performing the node operation on a PPS group basis. Here, the parity check matrix includes p×L rows and q×L columns, the p×L rows are grouped into p block rows, the q×L columns are grouped into q block columns, and each PPS group includes one column from each of the q block columns.

In accordance with another aspect of the present invention, a signal reception apparatus in a communication system is provided, in which q bit node updaters set an offset indicating a start position of a bit node operation for each block column of a parity check matrix of an LDPC code and perform a bit node operation on a received signal on a PPS group basis. q×$D_v$ check node updaters perform a check node operation on all check nodes connected to each bit node for which the bit node operation has been performed. Here, the parity check matrix includes p×L rows and q×L columns, the p×L rows are grouped into p block rows, the q×L columns are grouped into q block columns, and each PPS group includes one column from each of the q block columns.

In accordance with a further aspect of the present invention, a signal reception apparatus in a communication system is provided. A decoder decodes a received signal by setting an offset indicating a start position of a node operation for each block row of a parity check matrix of an LDPC code and scheduling an order of performing the node operation on a PPS group basis. Here, the parity check matrix includes p×L rows and q×L columns, the p×L rows are grouped into p block rows, the q×L columns are grouped into q block columns, and each PPS group includes one row from each of the p block rows.

In accordance with still another aspect of the present invention, a signal reception apparatus in a communication system is provided, in which q×$D_v$ check node updaters set an offset indicating a start position of a check node operation for each block row of a parity check matrix of an LDPC code and perform a check node operation on a received signal on a PPS group basis. q bit node updaters perform a bit node operation on all bit nodes connected to each check node for which the check node operation has been performed. Here, the parity check matrix includes p×L rows and q×L columns, the p×L rows are grouped into p block rows, the q×L columns are grouped into q block columns, and each PPS group includes one row from each of the p block rows.

In accordance with still further aspect of the present invention, a method for receiving a signal in a signal reception apparatus in a communication system is provided. A signal is received and decoded by setting an offset indicating a start position of a node operation for each block column of a parity check matrix of an LDPC code and scheduling an order of performing the node operation on a PPS group basis. Here, the parity check matrix includes p×L rows and q×L columns, the p×L rows are grouped into p block rows, the q×L columns are grouped into q block columns, and each PPS group includes one column from each of the q block columns.

In accordance with yet another aspect of the present invention, a method for receiving a signal in a signal reception apparatus in a communication system is provided. An offset indicating a start position of a bit node operation is set for each block column of a parity check matrix of an LDPC code, and a bit node operation is performed on a received signal on a PPS group basis. A check node operation is performed on all check nodes connected to each bit node for which the bit node operation has been performed. Here, the parity check matrix includes p×L rows and q×L columns, the p×L rows are grouped into p block rows, the q×L columns are grouped into q block columns, and each PPS group includes one column from each of the q block columns.

In accordance with yet further aspect of the present invention, a method for receiving a signal in a signal reception apparatus in a communication system is provided. A signal is received and decoded by setting an offset indicating a start position of a node operation for each block row of a parity check matrix of an LDPC code and scheduling an order of performing the node operation on a Partial PPS group basis. Here, the parity check matrix includes p×L rows and q×L columns, the p×L rows are grouped into p block rows, the q×L columns are grouped into q block columns, and each PPS group includes one row from each of the p block rows.

In accordance with yet still another aspect of the present invention, a method for receiving a signal in a signal reception apparatus in a communication system is provided. An offset indicating a start position of a check node operation is set for each block row of a parity check matrix of an LDPC code and a check node operation is performed on a received signal on a PPS group basis. A bit node operation is performed on all bit nodes connected to each check node for which the check node operation has been performed. Here, the parity check matrix includes p×L rows and q×L columns, the p×L rows are grouped into p block rows, the q×L columns are grouped into q block columns, and each PPS group includes one row from each of the p block rows.

BRIEF DESCRIPTION OF THE DRAWINGS

The above and other aspects, features and advantages of certain exemplary embodiments of the present invention will be more apparent from the following detailed description taken in conjunction with the accompanying drawings, in which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of exemplary embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The present invention provides a signal reception apparatus and method for performing Low Density Parity Check (LDPC) decoding using a Partial Parallel Scheduling (PPS) scheme in a communication system using an LDPC code.

More particularly, the present invention provides a signal reception apparatus and method for performing LDPC decoding using a PPS scheme so that any two non-zero block matrices have different shift parameters in each block row of a parity check matrix of the LDPC code. Also, the present invention provides a signal reception apparatus and method for performing LDPC decoding using a PPS scheme after setting an offset for each block column of the parity check matrix. Here, the offset indicates a start position where a node processor corresponding to the block column starts its operation, when the node processor performs a node operation.

Figure 1:
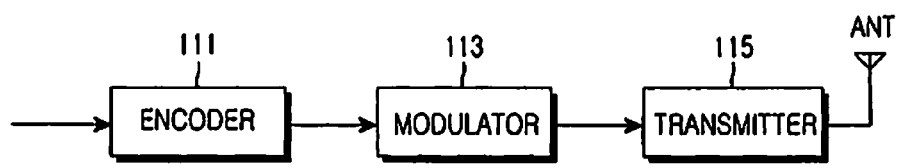
FIG. 1 is a block diagram of a signal transmission apparatus in a conventional communication system using LDPC codes.
Figure 2:
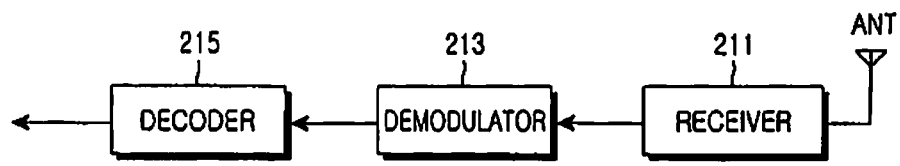
FIG. 2 is a block diagram of a signal reception apparatus in a conventional communication system using LDPC codes.

The PPS scheme-based LDPC decoding will be described in the context of a variable node operation, i.e. a bit node operation, as an example, but it is to be clearly understood that the PPS scheme-based LDPC decoding is also applicable to a check node operation. While not described specifically, an LDPC code can be decoded by the PPS scheme of the present invention in the conventional signal reception apparatus illustrated in FIG. 2. Before describing a signal reception apparatus and method for decoding an LDPC code by the PPS scheme, a parity check matrix that defines an LDPC code will first be described below.

As longer cycles are generated on an LDPC code bipartite graph, performance degradation, such as error floor, caused by cycles with a length less than a threshold length can be avoided. Here, the threshold can be 4. Therefore, it is important to generate a parity check matrix such that the bipartite graph does not have short cycles. Such a major parity check matrix is one that defines a structured LDPC code. Now a description will be made of the parity check matrix for the structured LDPC code.

Figures 3, 4:
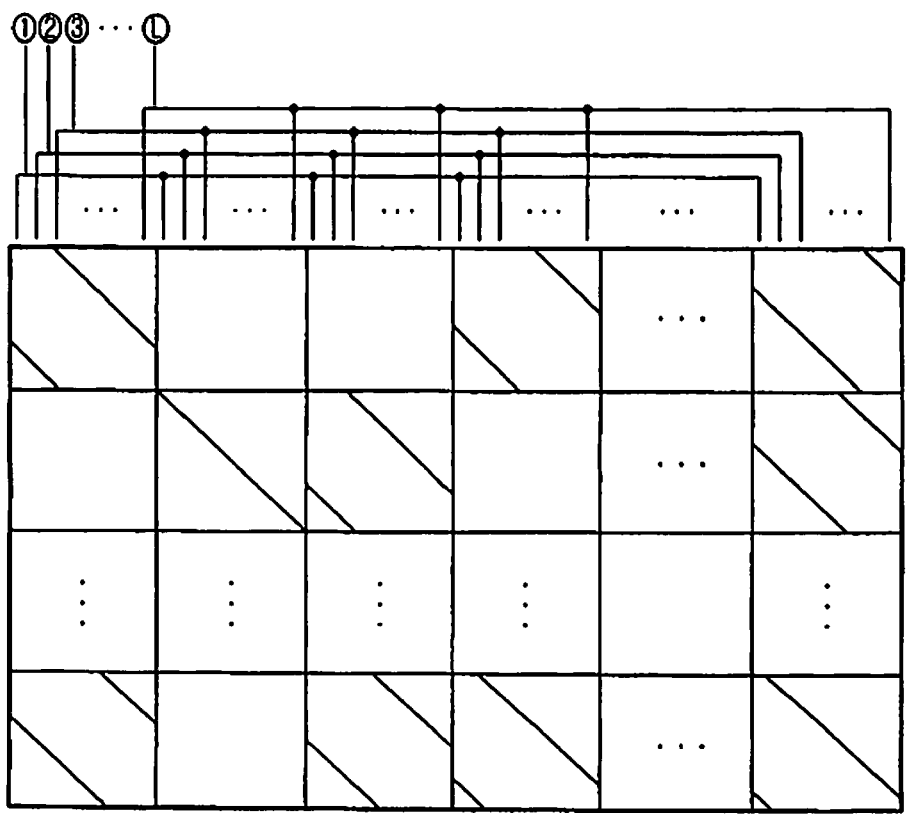
FIG. 3 illustrates a parity check matrix for a conventional structured LDPC code.
FIG. 4 illustrates a method for decoding a structured LDPC code by PPS according to an exemplary embodiment of the present invention.

FIG. 3 illustrates a parity check matrix for a conventional structured LDPC code.

Referring to FIG. 3, the parity check matrix of the structured LDPC code includes a plurality of blocks, each being a block matrix. The block matrix is one of an L×L permutation matrix and an L×L zero matrix, for example. The permutation matrix has a row weight of 1 for each row and a column weight of 1 for each column. For convenience sake, the permutation matrix is assumed to be a cyclic permutation matrix created by cyclically shifting an identity matrix to the right. The number of times by which the identity matrix is cyclically shifted to the right is defined as the shift parameter of the cyclic permutation matrix.

In FIG. 3, the parity check matrix of the structured LDPC code includes p×q blocks, each being a block matrix. $P_{ij}$ denotes a block matrix in an $i^{th}$ block row and a $j^{th}$ block column.

A method for decoding a structured LDPC code by PPS according to an exemplary embodiment of the present invention will be described with reference to FIG. 4.

FIG. 4 illustrates a method for decoding a structured LDPC code by PPS according to an exemplary embodiment of the present invention.

Referring to FIG. 4, in an exemplary implementation, a parity check matrix for the structured LDPC code includes p×q blocks each having an L×L block matrix. That is, the parity check matrix includes p×L rows and q×L columns. The p×L rows are grouped into p block rows each having L rows, and the q×L columns are grouped into q block columns each having L columns. Permutation matrices are arranged in blocks marked with slashed lines and zero matrices are arranged in the other blocks in FIG. 4.

Each PPS group is created by selecting one column from each of the q block columns so that the PPS group has a row weight of 1 or less. In FIG. 4, a first PPS group is generated by selecting the first column of each of the q block columns and a second PPS group is generated by selecting the second column of each of the q block columns. In this manner, an $L^{th}$ PPS group is generated by selecting an $L^{th}$ column of each of the q block columns. Thus, the first to $L^{th}$ PPS groups each have q columns. Also, the first to $L^{th}$ PPS groups each have a row weight less than or equal to a threshold row weight, for example, 1. A condition for setting the weight of an arbitrary block row in each PPS group to be 1 or less is that blocks corresponding to permutation matrices in an arbitrary block row have different shift parameters.

In the above-described manner, the parity check matrix of the structured LDPC code is generated by defining the first to $L^{th}$ PPS groups so that the weight of an arbitrary row is 1 or less in each PPS group. Thus, it becomes possible to decode a structured LDPC code by scheduling the order of performing a bit node operation on a PPS group basis.

Meanwhile, the present invention provides a signal reception apparatus and method for performing LDPC decoding using a PPS scheme after setting an offset for each block column of the parity check matrix. Here, the offset indicates a start position where a bit node processor corresponding to the block column starts its operation when it performs a node operation. It is possible to prevent a memory conflict between non-zero block matrices having the same shift parameters in any block row of the parity check matrix by decoding the LDPC code using the PPS scheme after setting offsets.

With reference to FIGS. 5A to 5D, a method for decoding a structured LDPC code using a PPS scheme after setting offsets will be described.

FIGS. 5A to 5D illustrate a method for decoding a structured LDPC code by a PPS scheme after setting an offset according to an exemplary embodiment of the present invention.

Figure 5:
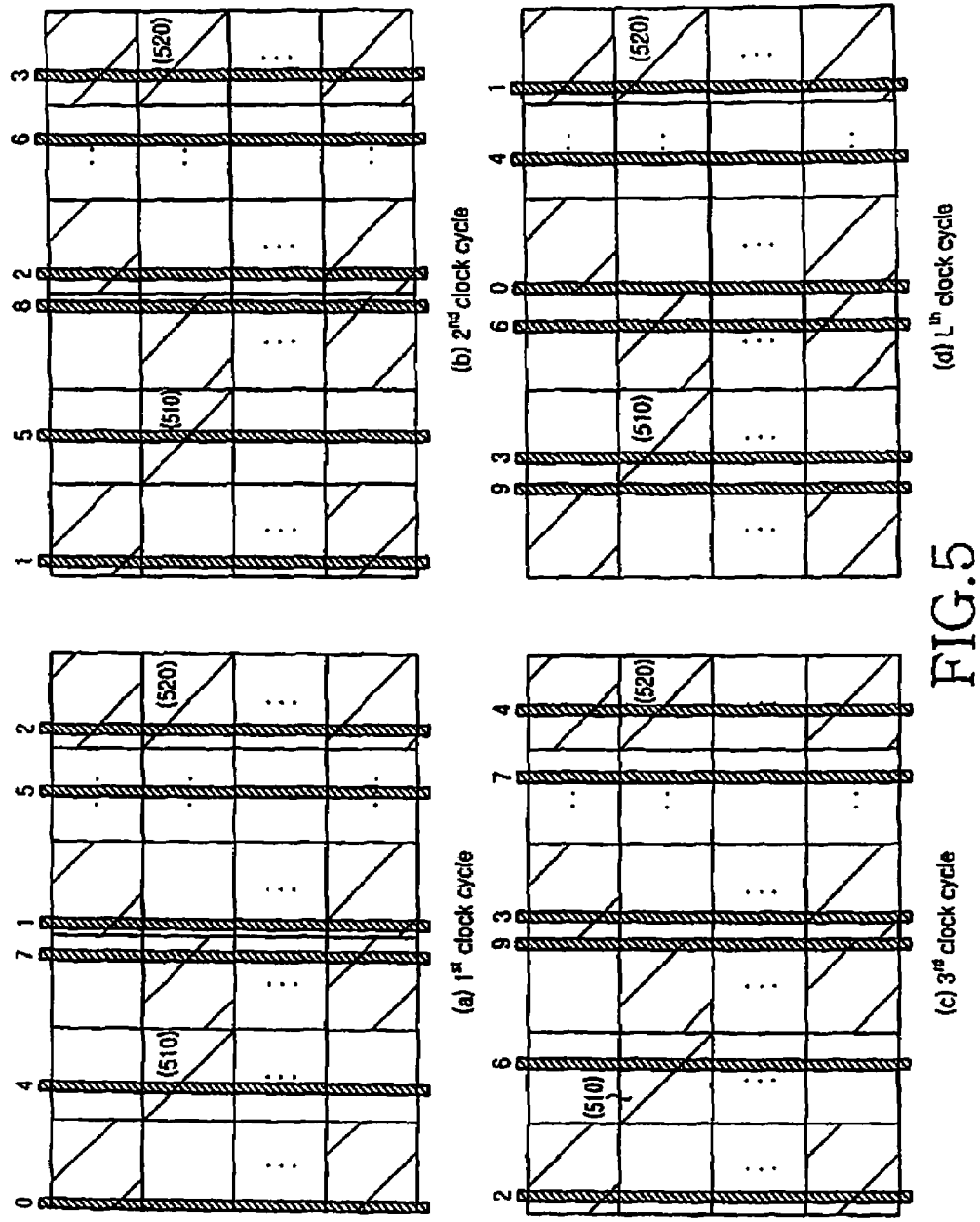
FIGS. 5A to 5D illustrate a method for decoding a structured LDPC code by PPS after setting an offset according to an exemplary embodiment of the present invention.

Before describing FIGS. 5A to 5D, it is noted that the parity check matrix illustrated in FIG5 has a structure similar to that of the parity check matrix illustrated in FIG. 4. In the parity check matrix illustrated in FIG. 5, p=4, q=6, and L=10. In FIG. 5, permutation matrices are arranged in blocks marked with slashed lines and zero matrices are arranged in the other blocks. It is assumed that blocks 510 and 520 of the parity check matrix have the same shift parameters. The block 510 is the first block having a non-zero matrix in the second block row and the block 520 is the third block having a non-zero matrix in the second block row of the parity check matrix.

Assuming that all bit node processors perform their operations, starting from the first columns of the block columns of the parity check matrix illustrated in FIG. 5 for decoding a structured LDPC code using the PPS scheme, bit node processors working on the second and sixth block columns of the parity check matrix operate for the same check node. Since the two different bit node processors read a message from the same address of a memory, a memory conflict occurs. To avoid this problem, the present invention sets an offset indicating a start position at which a bit node processor starts its operation for each of the In the illustrated case of FIG. 5, an LDPC code is decoded by setting offsets 0, 4, 7, 1, 5 and 2 for six block columns. These offsets serve the purpose of preventing L bit node processors from operating referring to the same check node at a given time instant. That is, a memory conflict between the second and sixth block columns is prevented during bit node operations by setting the offsets 0, 4, 7, 1, 5 and 2 for the six block columns.

Referring to FIG. 5, when the structured LDPC code is iteratively decoded once, i.e. during the first to $L^{th}$ clock cycles, the bit node processors operate at the following positions. It is assumed herein that the columns of each of the six block columns are labeled with 0 to 9.

In FIG. 5A, the operation positions of the bit node processors during the first clock cycle are columns 0, 4, 7, 1, 5 and 2, respectively. That is, in the first clock cycle, the bit node processor of the first block column operates at column 0, the bit node processor of the second block column operates at column 4, the bit node processor of the third block column operates at column 7, the bit node processor of the fourth block column operates at column 1, the bit node processor of the fifth block column operates at column 5, and the bit node processor of the sixth block column operates at column 2.

In FIG. 5B, the operation positions of the bit node processors during the second clock cycle are columns 1, 5, 8, 2, 6 and 3, respectively. That is, in the second clock cycle, the bit node processor of the first block column operates at column 1, the bit node processor of the second block column operates at column 5, the bit node processor of the third block column operates at column 8, the bit node processor of the fourth block column operates at column 2, the bit node processor of the fifth block column operates at column 6, and the bit node processor of the sixth block column operates at column 3.

In FIG. 5C, the operation positions of the bit node processors during the third clock cycle are columns 2, 6, 9, 3, 7 and 4, respectively. That is, in the third clock cycle, the bit node processor of the first block column operates at column 2, the bit node processor of the second block column operates at column 6, the bit node processor of the third block column operates at column 9, the bit node processor of the fourth block column operates at column 3, the bit node processor of the fifth block column operates at column 7, and the bit node processor of the sixth block column operates at column 4.

Referring to FIG. 5D, in the same manner, the operation positions of the bit node processors during the last, i.e. $L^{th}$ clock cycle are columns 9, 3, 6, 0, 4 and 1, respectively. That is, in the $L^{th}$ clock cycle, the bit node processor of the first block column operates at column 9, the bit node processor of the second block column operates at column 3, the bit node processor of the third block column operates at column 6, the bit node processor of the fourth block column operates at column 0, the bit node processor of the fifth block column operates at column 4, and the bit node processor of the sixth block column operates at column 1.

While the offsets are shown to be increased by 1 each time the clock cycle increases in FIG. 5, this is a mere exemplary application. Thus, the offsets can be increased by an arbitrary value, for example, k each time the clock cycle increases. As the description of FIG. 5 has been made with respect to bit node operations, the LDPC decoding is carried out by vertical PPS. On the other hand, if the description of FIG. 5 is made with respect to check node operations, the LDPC decoding can be carried out by horizontal PPS.

Now a description will be made of an LDPC decoder using PPS according to an exemplary embodiment of the present invention, with reference to FIG. 6.

Figure 6:
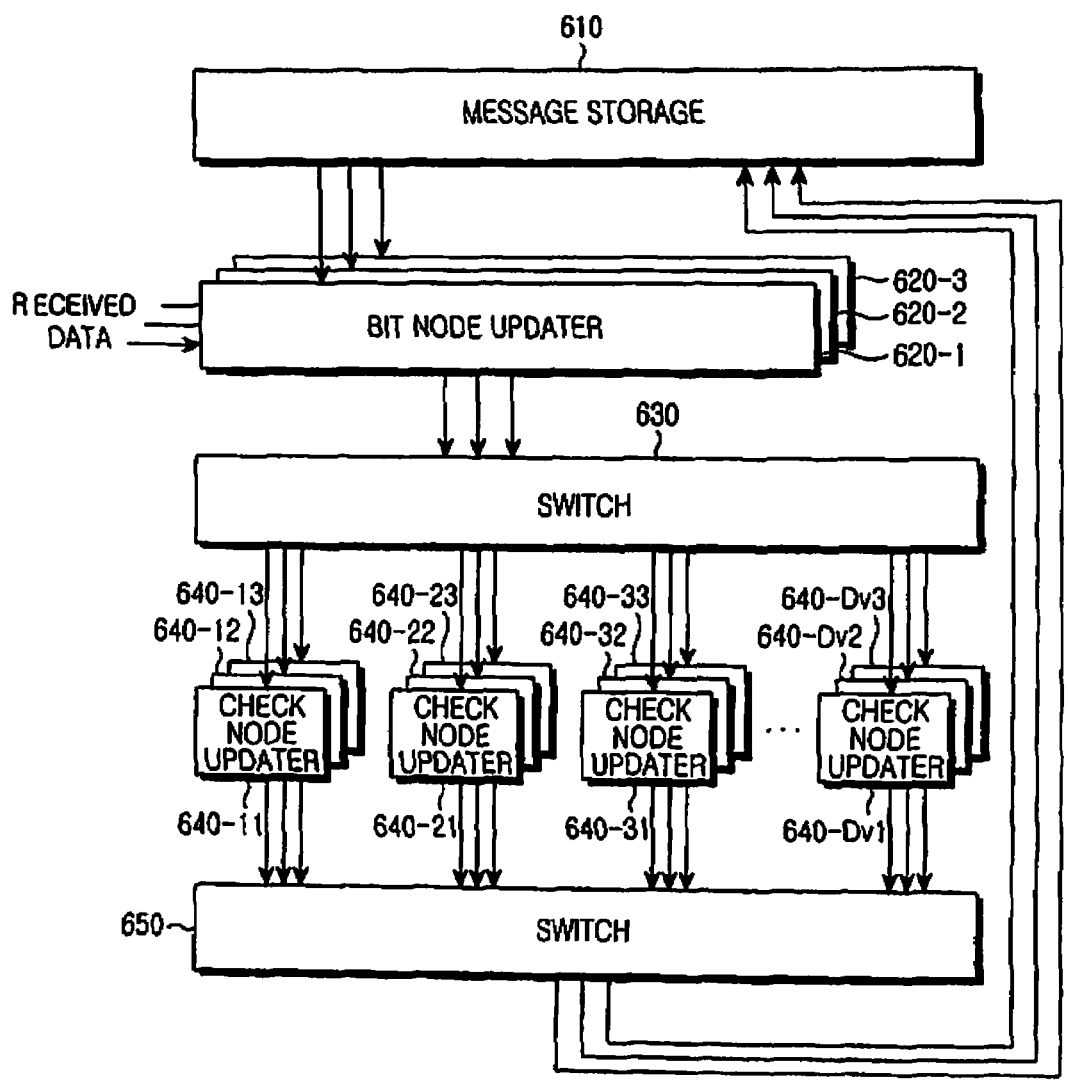
FIG. 6 is a block diagram of an LDPC decoder using PPS according to an exemplary embodiment of the present invention.

FIG. 6 is a block diagram of an LDPC decoder using PPS according to an exemplary embodiment of the present invention.

Before describing FIG. 6, it is assumed that a parity check matrix includes L PPS groups, each group having three block columns. In this case, the LDPC decoder includes a message storage 610, three bit node updaters 620-1, 620-2 and 620-3, a switch 630, $D_v \times 3$ check node updaters 640-11 to 640-Dv3, and a switch 650.

The bit node updaters 620-1, 620-2, and 620-3 receive data from the message storage 610, perform a bit node operation on the received data, and provide the results of the bit node operation to the check node updaters 640-11 to 640-Dv3 through the switch 630. The bit node updaters 620-1, 620-2, and 620-3 may or may not set offsets described with reference to FIG. 5 for their bit node operations. The bit node operations are beyond the scope of the present invention and thus their detailed description is not provided herein.

The check node updaters 640-11 to 640-Dv3 perform check node operations on neighbor check nodes connected to bit nodes updated by the bit node updaters 620-1, 620-2, and 620-3 and store the results of the check node operations in the message storage 610 through the switch 630. The check node operations are beyond the scope of the present invention and thus their detailed description is not provided herein.

In the illustrated case of FIG. 6, the check node updaters 640-11, 640-21, 640-31 . . . 640-Dv1 perform check node operations on neighbor check nodes connected to a bit node updated by the bit node updater 620-1. The check node updaters 640-12, 640-22, 640-32 . . . 640-Dv2 perform check node operations on neighbor check nodes connected to a bit node updated by the bit node updater 620-2. The check node updaters 640-13, 640-23, 640-33 . . . 640-Dv3 perform check node operations on neighbor check nodes connected to a bit node updated by the bit node updater 620-3.

In the PPS-based LDPC decoding, consequently, each bit node is updated once per iteration and check nodes are updated each time their neighbor bit nodes are updated. The PPS scheme accumulates updated check node operation results and reflects the accumulation in the next bit node operation during an iteration. The PPS scheme offers the benefit of fast Bit Error Rate (BER) performance convergence. That is, BER performance quickly converges with a relatively small number of iterations in the PPS scheme.

As the description of FIG. 6 has been made in the context of bit node operations, check node operations are performed on all check nodes connected to each bit node for which bit node operations have been performed. Meanwhile, although the description is made in the context of check node operations, bit node operations can be performed on all bit nodes connected to each check node for which check node operations have been performed.

As is apparent from the above description, the exemplary embodiments of the present invention advantageously reduces the time taken for LDPC decoding, while maintaining LDPC decoding performance by decoding an LDPC code in the PPS scheme.

While the invention has been shown and described with reference to certain exemplary embodiments of the present invention thereof, it will be understood by those skilled in the art that various changes in form and details may be made therein without departing from the spirit and scope of the present invention as defined by the appended claims and their equivalents.

What is claimed is:

1. A method for receiving a signal in a signal reception apparatus in a communication system, the method comprising:

receiving a signal; and decoding the received signal by setting an offset for each block column of a parity check matrix of a Low Density Parity Check (LDPC) code, the offset indicating a start position of a node operation and scheduling an order of performing the node operation on a Partial Parallel Scheduling (PPS) group basis, wherein the parity check matrix includes p×L rows and q×L columns, the p×L rows are grouped into p block rows, the q×L columns are grouped into q block columns, and each PPS group includes one column from each of the q block columns.

2. The method of claim 1, wherein a block row included in the each PPS group has a weight less than or equal to a threshold weight.

3. A method for receiving a signal in a signal reception apparatus in a communication system, the method comprising:

receiving a signal; and decoding the received signal by setting an offset for each block row of a parity check matrix of a Low Density Parity Check (LDPC) code, the offset indicating a start position of a node operation and scheduling an order of performing the node operation on a Partial Parallel Scheduling (PPS) group basis, wherein the parity check matrix includes p×L rows and q×L columns, the p×L rows are grouped into p block rows, the q×L columns are grouped into q block columns, and each PPS group includes one row from each of the p block rows.

4. A signal reception apparatus in a communication system, comprising:

a decoder for decoding a received signal by setting an offset for each block column of a parity check matrix of a Low Density Parity Check (LDPC) code, the offset indicating a start position of a node operation and scheduling an order of performing the node operation on a Partial Parallel Scheduling (PPS) group basis, wherein the parity check matrix includes p×L rows and q×L columns, the p×L rows are grouped into p block rows, the q×L columns are grouped into q block columns, and each PPS group includes one column from each of the q block columns.

5. The signal reception apparatus of claim 4, further comprising a receiver for receiving the signal.

6. The signal reception apparatus of claim 4, wherein a block row included in the each PPS group has a weight less than or equal to a threshold weight.

7. A signal reception apparatus in a communication system, comprising:
 a decoder for decoding a received signal by setting an offset for each block row of a parity check matrix of a Low Density Parity Check (LDPC) code, the offset indicating a start position of a node operation and scheduling an order of performing the node operation on a Partial Parallel Scheduling (PPS) group basis,
 wherein the parity check matrix includes p×L rows and q×L columns, the p×L rows are grouped into p block rows, the q×L columns are grouped into q block columns, and each PPS group includes one row from each of the p block rows.

8. The signal reception apparatus of claim 7, further comprising a receiver for receiving the signal.

9. A method for receiving a signal in a signal reception apparatus in a communication system, the method comprising:
 setting an offset for each block column of a parity check matrix of a Low Density Parity Check (LDPC) code, the offset indicating a start position of a bit node operation, and performing a bit node operation on a received signal on a Partial Parallel Scheduling (PPS) group basis; and
 performing a check node operation on all check nodes connected to each of bit nodes for which the bit node operation has been performed,
 wherein the parity check matrix includes p×L rows and q×L columns, the p×L rows are grouped into p block rows, the q×L columns are grouped into q block columns, and each PPS group includes one column from each of the q block columns.

10. The method of claim 9, wherein a block row included in the each PPS group has a weight less than or equal to a threshold weight.

11. A method for receiving a signal in a signal reception apparatus in a communication system, the method comprising:
 setting an offset for each block row of a parity check matrix of a Low Density Parity Check (LDPC) code, the offset indicating a start position of a check node operation, and performing a check node operation on a received signal on a Partial Parallel Scheduling (PPS) group basis; and
 performing a bit node operation on all bit nodes connected to each of check nodes for which the check node operation has been performed,
 wherein the parity check matrix includes p×L rows and q×L columns, the p×L rows are grouped into p block rows, the q×L columns are grouped into q block columns, and each PPS group includes one row from each of the p block rows.

12. A signal reception apparatus in a communication system, comprising:
 q bit node updaters for setting an offset for each block column of a parity check matrix of a Low Density Parity Check (LDPC) code, the offset indicating a start position of a bit node operation, and performing a bit node operation on a received signal on a Partial Parallel Scheduling (PPS) group basis; and
 $q \times D_v$ check node updaters for performing a check node operation on all check nodes connected to each of bit nodes for which the bit node operation has been performed,
 wherein the parity check matrix includes p×L rows and q×L columns, the p×L rows are grouped into p block rows, the q×L columns are grouped into q block columns, and each PPS group includes one column from each of the q block columns.

13. The signal reception apparatus of claim 12, wherein a block row included in the each PPS group has a weight less than or equal to a threshold weight.

14. A signal reception apparatus in a communication system, comprising:
 $q \times D_v$ check node updaters for setting an offset for each block row of a parity check matrix of a Low Density Parity Check (LDPC) code, the offset indicating a start position of a check node operation, and performing a check node operation on a received signal on a Partial Parallel Scheduling (PPS) group basis; and
 q bit node updaters for performing a bit node operation on all bit nodes connected to each of check nodes for which the check node operation has been performed,
 wherein the parity check matrix includes p×L rows and q×L columns, the p×L rows are grouped into p block rows, the q×L columns are grouped into q block columns, and each PPS group includes one row from each of the p block rows.

* * * * *